(12) United States Patent
Maune

(10) Patent No.: US 7,668,212 B2
(45) Date of Patent: Feb. 23, 2010

(54) OPTICALLY TRIGGERED Q-SWITCHED PHOTONIC CRYSTAL LASER AND METHOD OF SWITCHING THE SAME

(75) Inventor: Brett Maune, New York, NY (US)

(73) Assignee: California Institute of Technology, Pasadena, CA (US)

( * ) Notice: Subject to any disclaimer, the term of this patent is extended or adjusted under 35 U.S.C. 154(b) by 128 days.

(21) Appl. No.: 11/338,495

(22) Filed: Jan. 23, 2006

(65) Prior Publication Data
US 2006/0239305 A1 Oct. 26, 2006

Related U.S. Application Data

(60) Provisional application No. 60/647,088, filed on Jan. 26, 2005.

(51) Int. Cl.
*H01S 3/11* (2006.01)
(52) U.S. Cl. .............................. 372/10; 372/14; 372/17; 372/20; 372/98; 372/105
(58) Field of Classification Search .................. 372/10, 372/14, 17, 30, 54, 105, 106, 20, 98
See application file for complete search history.

(56) References Cited

U.S. PATENT DOCUMENTS

| 6,058,127 | A * | 5/2000 | Joannopoulos et al. ......... 372/92 |
| 7,480,319 | B2 * | 1/2009 | Scherer ..................... 372/38.01 |
| 2002/0074537 | A1 * | 6/2002 | John et al. .................. 252/584 |
| 2003/0048817 | A1 * | 3/2003 | Steffens et al. ................ 372/20 |
| 2004/0252741 | A1 * | 12/2004 | Meyer et al. .................. 372/67 |
| 2005/0110992 | A1 * | 5/2005 | Scherer et al. .............. 356/318 |
| 2005/0152429 | A1 * | 7/2005 | Scherer ........................ 372/92 |
| 2005/0163419 | A1 * | 7/2005 | Scherer ........................ 385/16 |

OTHER PUBLICATIONS

Dessislava Sainova et al. "Photoaddressable Alignment Layers for Fluorescent Polymers in Polarized Electroluminescence Devices" Advanced Functional Materials vol. 12, No. 1, 2002, pp. 49-57.*
"Photoaddressable polymers for liquid crystal alignment", Institute of Physics, University of Potsdam, vol. 30, p. 337-344, Mar. 3, 2003.*
"Liquid-crystal electric tuning of a photonic crystal laser", Applied Physics Letters, vol. 85, No. 3, Jul. 19, 2004.*

* cited by examiner

*Primary Examiner*—Minsun Harvey
*Assistant Examiner*—Yuanda Zhang
(74) *Attorney, Agent, or Firm*—Daniel L. Dawes; Marcus C. Dawes

(57) ABSTRACT

An improvement in a method of controlling lasing in a semiconductor laser fabricated in a photonic crystal laser having a plurality of holes into which a birefringent material with low refractive losses and low optical loses with controllable spatial refractive index orientation has been infiltrated comprises the step of rotating the molecular orientation or changing the physical orientation of the birefringent material infiltrated into the holes of the photonic crystal laser to switch cavity modes. The liquid crystal is aligned by use of an alignable photo addressable polymer layer adjacent to the liquid crystal. The cavity modes are optically switched within the laser without any requirement of external energy to maintain the lasing state of the laser, which allows its use as a memory element.

8 Claims, 4 Drawing Sheets

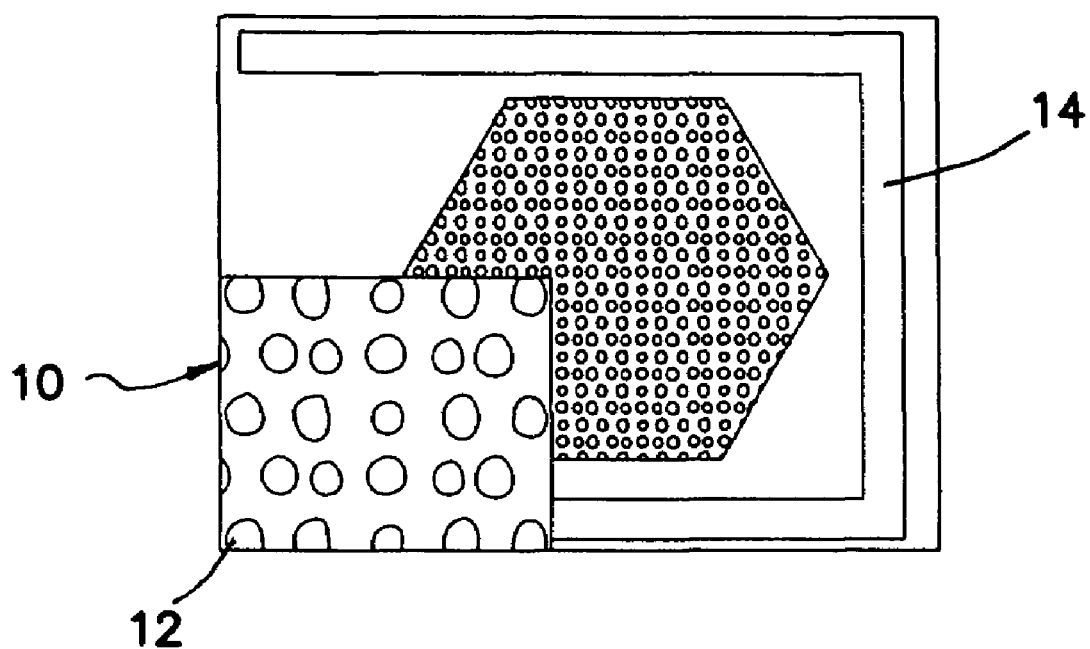
FIG. 1
FIG. 2A  FIG. 2B
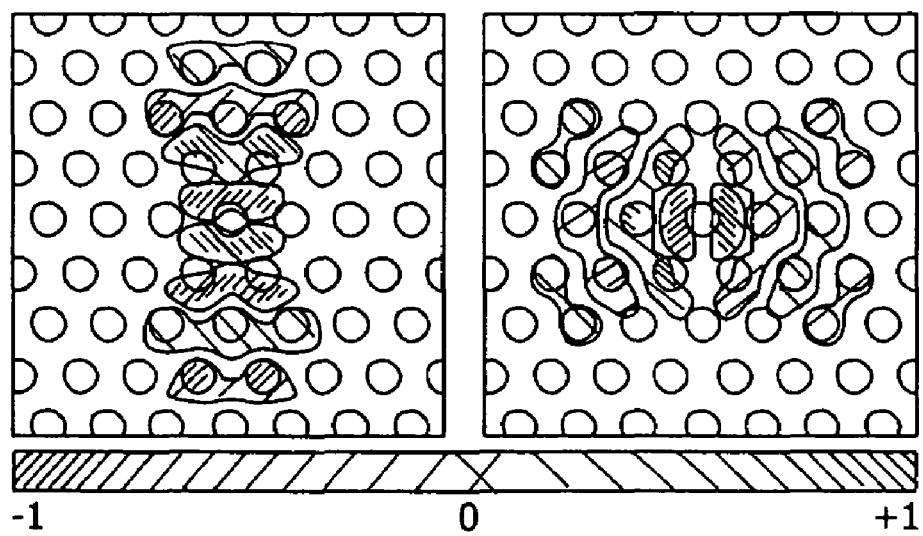

OPTICALLY TRIGGERED Q-SWITCHED PHOTONIC CRYSTAL LASER AND METHOD OF SWITCHING THE SAME

RELATED APPLICATIONS

The present application is related to U.S. Provisional Patent Application, Ser. No. 60/647,088, filed on Jan. 26, 2005, which is incorporated herein by reference and to which priority is claimed pursuant to 35 USC 119.

GOVERNMENT SUPPORT

The present application was funded by DARPA pursuant to grant no. HR0011-04-1-0032. The U.S. Government has certain rights.

BACKGROUND OF THE INVENTION

1. Field of the Invention

The invention relates to the field of wavelength and polarization tunable photonic crystal (PC) lasers and methods of switching the same.

2. Description of the Prior Art

Optics and fluidics have been historically integrated within systems that combine separate light sources, fluidic reservoirs and filters. Integration on a sub-millimeter scale has resulted in spectroscopic tools and liquid crystal (LC) displays. With the advent of photonic crystals (PCS) it has recently become possible to further integrate sources, filters and fluidic reservoirs and to define monolithic micrometer sized "opto-fluidic" devices". With their intrinsically porous nature and ability to confine and manipulate optical fields, photonic crystals are ideally suited for nanoscale opto-fluidic integration. This miniaturization enables a much more efficient interaction between the optical field and the injected fluids and is leading to the emergence of a new class of functional opto-fluidic devices in which the optical functionality is controlled through the introduction of liquids.

Previous efforts in tuning photonic crystal laser emission have included tuning the emission by lithographically controlling the cavity size, infiltrating the photonic crystal with liquids of different refractive indices, and also by electrostatically rotating infiltrated liquid crystal. All three methods tune emission by changing the effective cavity optical path length.

The major drawback of lithographic tuning is that it is static, because a given fabricated laser has a set emission wavelength. Tuning is achieved by fabricating multiple lasers with different cavity geometries.

The second method, namely infiltrating a photonic crystal laser with liquids featuring different refractive indices, can yield large tuning ranges but the tuning of the laser is a tedious process involving extraction of the infiltrated liquid and replacing it with another possessing a different refractive index.

The third method of tuning, namely via rotation of infiltrated liquid crystal, is limited by the relatively small effective cavity optical path length change achieved by rotating liquid crystal. Due to screening by the semiconducting slab and strong surface anchoring effects within the holes of the photonic crystal, the liquid crystal orientation can only be effectively controlled in the top cladding layer, thus greatly limiting the achievable tuning.

What is needed is an optically tunable laser and a method of tuning a laser which would be adaptable to functional opto-fluidic devices in which the optical functionality is controlled through the introduction of liquids.

BRIEF SUMMARY OF THE INVENTION

The quality factor (Q) and wavelength of a photonic crystal (PC) cavity mode is dependent upon the ambient refractive index (refractive index of holes and cladding layers). In general, as the ambient refractive index increases, the cavity mode's Q decreases and its wavelength shifts to longer wavelengths. The mode's decrease in Q is primarily due to less vertical confinement (total internal reflection) attributed to the smaller refractive index contrast between the semiconductor photonic crystal slab and cladding layers. The increase in the mode's resonating wavelength is due to the optical path length increase resulting from the higher refractive index. Therefore, by adjusting the ambient refractive index experienced by a mode, one can control both the mode's Q and its wavelength.

The refractive index experienced by a photonic crystal cavity mode due to an infiltrated birefringent material is dependent upon the relative orientation of the material to the polarization of the mode. If a cavity is designed that supports two orthogonally polarized modes, then infiltration with a birefringent material (e.g. liquid crystal) can be used to selectively tune the modes. For example, by rotating infiltrated liquid crystal in the cladding layer of a photonic crystal, one cavity mode can experience the liquid crystal's maximum refractive index while the other mode experiences the minimum. Since the cladding refractive index is different for the two modes, their relative Qs can be tuned. If a lasing mode's Q is lowered enough (increased losses), the lasing can be quenched. Thus, by controlling the orientation of an infiltrated birefringent material the lasing emission wavelength and polarization can be switched between the two cavity modes.

The primary advantage in the Q-switched photonic crystal laser implementation is that the bulk of the tuning is achieved by switching the laser emission between two different cavity modes. Some additional tuning is obtained by changing the cavity optical path length due to the rotating the molecular orientation of the liquid crystal. The tuning of the Q-switched laser is limited not by the birefringence of the infiltrated material, but rather by the difference in wavelengths of the cavity modes.

Besides an extremely large wavelength tuning range, another advantage of the Q-switching implementation is that the laser's emission polarization can also be controlled. Furthermore, in the experimentally demonstrated tunable laser the liquid crystal is aligned by an optically oriented photo addressable polymer layer. The realized Q-switched photonic crystal laser is an all-optical switch that does not require external electrical energy (e.g. a battery to support an electrostatic field) to maintain its lasing state and also qualifies the laser to serve as a memory element in optical information processing architectures.

One aspect of the illustrated embodiment relates to the selection of birefringent material. The functioning of the Q-switched laser may potentially be achieved with a variety of birefringent materials, liquid crystal just being one of them. In principle, any birefringent material with a "suitable birefringence", "sufficiently low refractive indices", "sufficiently low optical losses", and which exhibits a mechanism by which to control its spatial refractive index orientation, e.g. by changing the physical orientation of the birefringent material or by changing the material's electronic distribution, can be used as the switching element in the Q-switched laser. For example, an alternative to liquid crystal is to directly use photo addressable polymer as the tuning element instead of as a liquid crystal alignment layer. Photo addressable polymer, itself, has tremendous potential in tuning photonic crystal lasers.

Another aspect of the illustrated embodiment relates to the control of birefringent material orientation. Several possibilities exist for controlling the orientation of liquid crystal. The liquid crystal was oriented optically using a layer of photo addressable polymer but can also be aligned without the aid of photo addressable polymer, with electrostatic fields generated by electrodes, other types of alignment layers, such as polyimide layers or by inducing phases transitions within the liquid crystal by changing its temperature. If a different birefringent material is used instead of liquid crystal, then further alignment mechanisms may be possible.

Still another aspect of the illustrated embodiment relates to supported cavity modes. Photonic crystal cavities can be designed exhibiting more than two orthogonally polarized modes. In principle, switching could be achieved between more than two modes.

Yet another aspect of the illustrated embodiment relates to switching characteristics. As the liquid crystal was rotated, the Q-switched photonic crystal laser switched from one lasing mode to another. Other switching possibilities include multiple simultaneous lasing modes with a subset of modes switching "on' and "off" and also a laser that has all of its lasing modes simultaneously switch "off' or "on".

Thus the illustrated embodiment of the invention contemplates within its spirit and scope:
  a. photonic crystal laser wavelength tuning mechanism due to selection of one of two orthogonally polarized lasing modes.
  b. photonic crystal lasing emission polarization controlled by selection of one of two orthogonally polarized lasing modes.
  c. Optically triggered photo-addressable-polymer/liquid-crystal alignment layer enables all-optical implementation with no external energy source required for the laser to maintain its lasing state.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The invention can be better visualized by turning now to the following drawings wherein like elements are referenced by like numerals.

BRIEF DESCRIPTION OF THE DRAWINGS

FIG. 1 is a scanning electron micrograph of a fabricated photonic crystal laser.

FIGS. 2a and 2b are simulation results of photonic crystal cavity mode profiles and simulated Qs of the modes. Finite-difference time-domain simulation of Z component of magnetic field for X-polarized mode is shown in FIG. 2a and for Y-polarized mode in FIG. 2b.

Figure 2C:
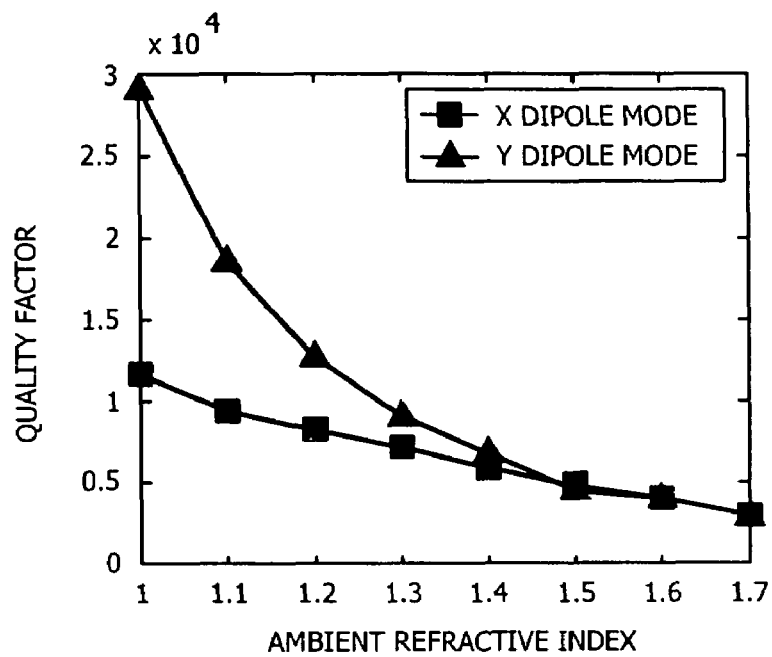
FIG. 2c is a graph of simulated Q for X and Y-polarized cavity modes as a function of the ambient refractive index.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

The illustrated embodiment involves the use of nonlinear liquids to create optically triggered quality-factor-switched (Q-switched) photonic crystal lasers 18. By infiltrating a photonic crystal laser 18 with an optically birefringent liquid crystal 34, and controlling the liquid crystal molecular orientation with a layer of photo addressable polymer 16, the lasing mode can be switched between X-polarized and Y-polarized dipole modes. The infiltrated liquid crystal 34 enables control over both polarization and wavelength emitted by the photonic crystal laser 18 and offers an example of an electromagnetically optimized device in which high optical fields and nonlinear material interact intimately.

Microfabricated photonic crystal cavities 10 enable the efficient interaction of the confined lasing field with various optical materials. Although the light emission of the lasing mode is generated within the semiconductor material, it is possible to design high-Q optical cavities 10 in which a large fraction of the mode's electromagnetic energy is concentrated within the photonic crystal's holes and cladding layers. This property of photonic crystal lasers 18 enables the introduction of a host of materials featuring a wide variety of optical properties through infiltration into the holes of the photonic crystal or by depositing these to form the cladding layers.

Previously it has been shown that the photonic crystal laser wavelength can be tuned by back-filling the photonic crystal with liquids of different refractive indices. Electrostatic tuning of photonic crystal lasers 18 was also demonstrated by injecting nematic liquid crystal into the lasers 18 and constructing electrostatic cells around them. An applied voltage then reorients the liquid crystal molecules, changes the optical cavity length, and reversibly tunes the lasing wavelength. Thus, the lasing wavelength can be controlled by modifying the effective refractive index of the cavity and optical path length of the lasing mode.

In the illustrated embodiment of the invention we demonstrate an even more efficient tuning mechanism for a photonic crystal laser 18 which is comprised of the steps of changing the relative Qs between two competing cavity modes within the laser 18 and thereby selecting the lasing mode. Although infiltration of photonic crystal cavities 10 with liquid crystals 34 enables spectral tuning, the cavity's Q substantially decreases due to the higher refractive index of the liquid crystal 34. The lower Q arises from a smaller refractive index contrast between the photonic crystal slab 36 and liquid crystal cladding layers 34, reducing vertical confinement of the optical mode.

Moreover, light scattering from heterogeneously oriented or misaligned liquid crystal molecules results in further laser losses. Thus, infiltration of a photonic crystal cavity 10 with liquid crystal 34 presents a tradeoff between decreasing Qs and increases in cavity tunability. Consequently, the nematic liquid crystal 34 chosen for the illustrated embodiment (ZLI-3086 from Merck) offers a compromise which features adequate birefringence for tunability ($n_o=1.5040$, $n_e=1.6171$ at 589 nm) while simultaneously exhibiting a reasonably low $n_o$ and $n_e$ values to obtain a sufficient cavity Q for lasing. Here $n_o$ is the minimum index of refraction and $n_e$ is the maximum index of refraction. By infiltrating the lasers 18 with refractive index calibrated fluids and comparing the lasing redshift with that of the liquid crystal infiltrated laser 18, we estimated the minimum and maximum IR refractive indices of the liquid crystal 34 to be $n_o=1.47$ and $n_e=1.58$. This analysis assumes the liquid crystal 34 spontaneously arranged itself randomly within the photonic crystal 36.

A further benefit of liquid crystal ZLI-3086 is its ability to be aligned by a photo addressable polymer 16, rendering it optically controllable and avoiding the need for electrostatic contacts. The Q-switched photonic crystal laser 18 is based on a cavity design that supports two orthogonally polarized modes with high Qs even after liquid crystal infiltration.

Extensive finite-difference time-domain (FDTD) simulations were conducted to develop such a cavity geometry. A scanning electron microscope image of the optimized cavity 10 of a fabricated photonic crystal laser 18 is shown in the microphotograph of FIG. 1, which is best seen in the inset enlargement. The periodicity of holes is 450 nm. The inset shows a close-up of the cavity geometry taken with the photonic crystal laser 18 tilted 15°. The cavity 10 combines a square-like lattice defect 12 embedded within a graded hexagonal lattice 14. This cavity geometry yields two dipole-like high-Q modes, one polarized along the X axis of the crystal and the other polarized along the Y axis as shown in FIGS. 2a and 2b. Finite-difference time-domain simulation of Z component of magnetic field for X-polarized mode is shown in FIG. 2a and for Y-polarized mode in FIG. 2b. Simulations of Q values as a function of ambient refractive index are summarized in the graph of FIG. 2c where Q is shown as a function of ambient refractive index for the X and Y dipoles. The X and Y modes feature a Q of approximately 12,000 and 30,000, respectively in air and remain above 4,000 even when the photonic crystal is surrounded by an ambient refractive index n of about 1.5. The simulated cavity Qs are for photonic crystals 36 with an isotropic ambient refractive index. Simulations involving anisotropic ambient refractive indices that mimic the infiltrated liquid crystal 34 (in particular asymmetric cladding hole layer configurations) yield lower Qs.

Photonic crystal lasers 18 using this design were constructed from InGaAsP quantum well material by using a combination of conventional electron beam lithography and dry etching steps. Details of the laser fabrication procedure are well known in the art and are not further described. See Loncar, M., Scherer, A., & Qiu, Y. "Photonic crystal laser sources for chemical detection", Appl. Phys. Lett. 82, 4648, (2003). After fabrication, the lasers 18 were infiltrated with the liquid crystal 34, and cells 32 were constructed around the lasers 18 which included a photo addressable polymer alignment layer 16 as shown in the perspective view of FIG. 3a, which shall be more fully described below.

Figure 3A:
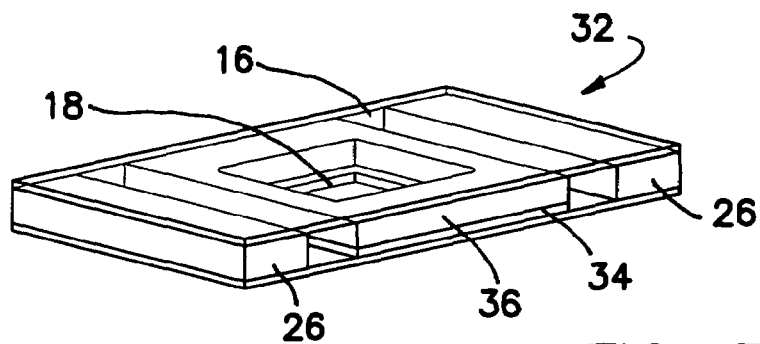
FIGS. 3a-3c are schematic diagrams of a liquid crystal cell, an optical setup, and a photo addressable polymer/liquid crystal photoinduced alignment respectively.
Figure 3B:
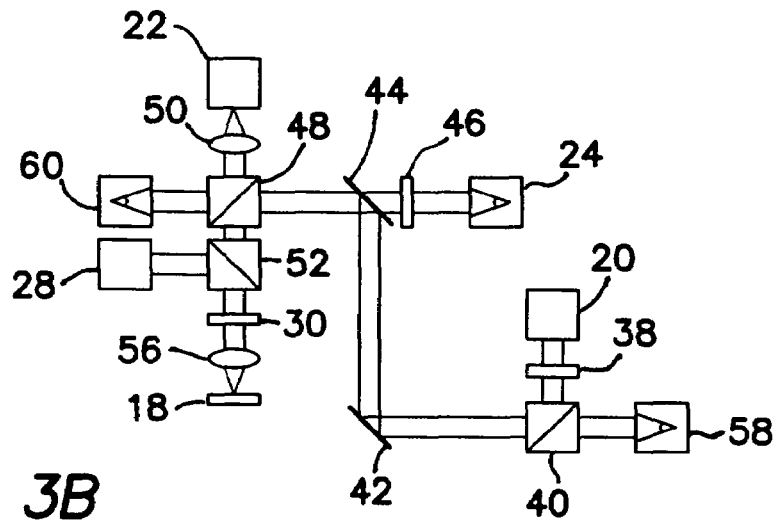
Figure 3C:
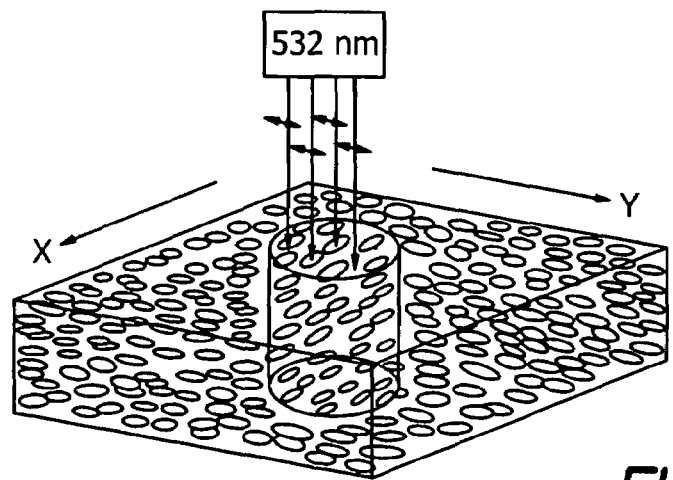

FIGS. 3a-3c are schematic diagrams of a liquid crystal cell 32, of an optical setup for characterizing the laser 18, and of a photo addressable polymer/liquid crystal photoinduced alignment. FIG. 3a is a schematic of a photonic crystal laser liquid crystal/photo addressable polymer cell, generally denoted by reference numeral 32. Thickness of liquid crystal layer 34 and photo addressable polymer layer 16 are approximately 5 μm, and 31±1 nm, respectively. The top coverslip on which layers 16/34 are formed and as described below is not shown. FIG. 3b is a schematic of a photonic crystal laser optical characterization setup. FIG. 3c is a schematic representation of the liquid crystal reorientation via photo addressable polymer photoinduced alignment, which occurs in hetero-layer 16/34. The photo addressable polymer 16 orients itself orthogonally (along X axis) with respect to the writing laser polarization direction (Y axis) which in turn induces a similar alignment in the liquid crystal 34.

Consider first a method for fabrication of the photo addressable polymer layer or film 16. The photo addressable polymer 16 used in the illustrated embodiment contains azobenzene chromophores and mesogenic side groups and was dissolved in tetrahydrofuran with a concentration of 15 g/L. The solution was mixed for 10 minutes with a magnetic stir bar to help insure complete dissolution of the photo addressable polymer 16 in the solvent. The photo addressable polymer 16 was then spun on a coverslip at 3500 RPM for 40 seconds. The photo addressable polymer 16 was deposited on the coverslip after the coverslip was already spinning at the target RPM to aid in creating a homogenous film. Finally, the photo addressable polymer 16 was baked on a hotplate at 60° C. for 10 minutes to ensure complete solvent removal. Atomic force microscopy measurements indicate the photo addressable polymer film thickness to be 31±1 nm with an estimated surface roughness of 1 nm.

Consider next the fabrication of a liquid crystal cell 32 of FIG. 3a. To construct the liquid crystal cell 32 around the lasers 18, the photonic crystal 36 along with two spacers 26 were attached to a glass microscope slide (not shown) with polymethylmethacrylate (PMMA). Next, a drop of the liquid crystal ZLI-3086 was placed on the photonic crystal 36 and the photo addressable polymer film 16 as carried on the coverslip was glued to the spacers 26 with the photo addressable polymer 16 facing towards the liquid crystal 34. The spacers 26 were sufficiently thick to provide an estimated 5 μm gap between crystal 36 and photo addressable polymer film 16.

Turn now to the step of writing into the photo addressable polymer 16. The photo addressable polymer 16 was written using 532 nm light from a frequency-doubled Nd:YAG laser 20 shown in FIG. 3b with an intensity ranging from 6 W/cm² (X polarization) to 12 W/cm² (Y polarization) and with a spot size of approximately 11 μm. In the illustrated setup writing laser 20 was coupled through a polarizer 38 and split beam mirror 40, mirror 42, dichroic mirror 44 and thence to beam combiner 48. The writing beam then was directed through beam splitter 52, removable polarizer 30, and focusing optics 56 onto laser 18.

To ensure writing saturation, the photo addressable polymer 16 was written for intervals of one second, although the onset of tuning was observed even for the shortest writing intervals of approximately 10 ms. The writing of the photo addressable polymer 16 occurs during photo-induced isomerization cycles between the trans and cis conformations of the azo moiety and has an absorption cutoff of approximately 630 nm. The visible absorption cutoff is critical for it means the pump beam from pump laser 22 (830 nm) does not write the photo addressable polymer 16. The output of pump laser 22 was collected and focused by optics 50 and directed to beam splitter 48. A portion was directed to power meter 60 for control purposes and the remainder was then directed through beam splitter 52, polarizer 30 and optics 56 onto laser 18.

A low intensity white light 28 was used for imaging purposes to initially locate individual photonic crystal lasers 18. White light was directed through beam splitter 52 to polarizer 30 and optics 56 onto laser 18. A removable polarizer 30 oriented along the Y axis was always used with the white light to prevent photobleaching and to initialize the photo addressable polymer 16 to the same orientation for the subsequent laser characterization. Imaging of laser 18 was accomplished through the optical circuit of laser 18, optics 56, polarizer 30 if in place, beam splitters 52, 48, dichroic mirror 44, mirror 42, and beam splitter 40 to CCD imaging camera 58.

Finally, the tunable photonic crystal lasers 18 were also mounted in an optical test setup as shown in the schematic diagram of FIG. 3b for characterization. Lasing spectra were recorded by optical pumping of the photonic crystal cavities 10 with pump laser 22 while systematically varying the liquid crystal orientation in the top cladding layer via the photo addressable polymer layer 16. The photo addressable polymer orientation is controlled by illuminating the photonic crystal laser 18 with polarized 532 nm light from a frequency-doubled Nd:YAG laser 20 as shown in FIG. 3b. As the photo addressable polymer 16 orients itself orthogonally with respect to the writing laser polarization, the liquid crystal molecules in layer 34 are in turn oriented parallel to that layer 16 as diagrammatically depicted in FIG. 3c.

Immediately after spin-coating, the photo addressable polymer 16 possessed a planar orientation but invariably underwent photobleaching as it was repeatedly written throughout the measurement process. A typical measurement cycle consists of first writing the photo addressable polymer 16 with the green laser and subsequently pumping the photonic crystal cavity 10 with a near-IR laser 22. The laser spectrum can then be recorded with an optical spectrum analyzer 24 through the optical path of laser 18, optics 56, (polarizer 30 being removed), beam splitters 52 and 48, and dichroic mirror 44 and (polarizer 46 being removed) to optical spectrum analyzer 24. Spectra recorded for a photonic crystal cavity 10 that supports two high-Q lasing modes are shown in the spectral graphs of FIGS. 4a and 4b. As the photo addressable polymer's orientation is varied from the Y to the X axis, the liquid crystal 34 in contact with the photo addressable polymer 16 undergoes the same rotation, and this realignment propagates through the bulk liquid crystal 34 in the cladding layer above the laser cavity 10.

Due the orthogonality of cavity modes, as the liquid crystal 34 is rotated from the Y axis to the X axis, one cavity mode experiences a maximum cladding index ($n_e$) whereas the other mode experiences a minimum refractive index ($n_0$). As the refractive index of one mode increases, its lasing wavelength red-shifts and its Q decreases until the lasing is quenched by increased losses and gain competition with the other mode. Conversely, the orthogonal mode's resonance blue-shifts and its Q increases until that mode is driven above threshold and starts lasing. Thus, rotating the liquid crystal 34 switches the laser output from one polarized mode to the other. This switching between lasing cavity modes effectively amplifies the spectral tunability of the cavity 10 beyond what would be possible by tuning the cavity length of a single mode. The switching in the photonic crystal lasers 18 is both reversible and reproducible as supported by many switching cycles with little loss in fidelity.

Lasing after liquid crystal infiltration was confirmed by the recording of a characteristic output power versus input power curve (L-L curve). The lasing modes were also linearly polarized in agreement with FDTD simulations. See the insets of FIGS. 4a and 4b. The photonic crystal lasers 18 were pumped with 4.3 mW from a semiconductor laser diode at 830 nm with a pulse length of 30 ns and a periodicity of 3.0 µs. Pump light was transmitted through the transparent coverslip, photo addressable polymer film 16, and the liquid crystal 34 onto the photonic crystal slab 36.

Figure 4C:
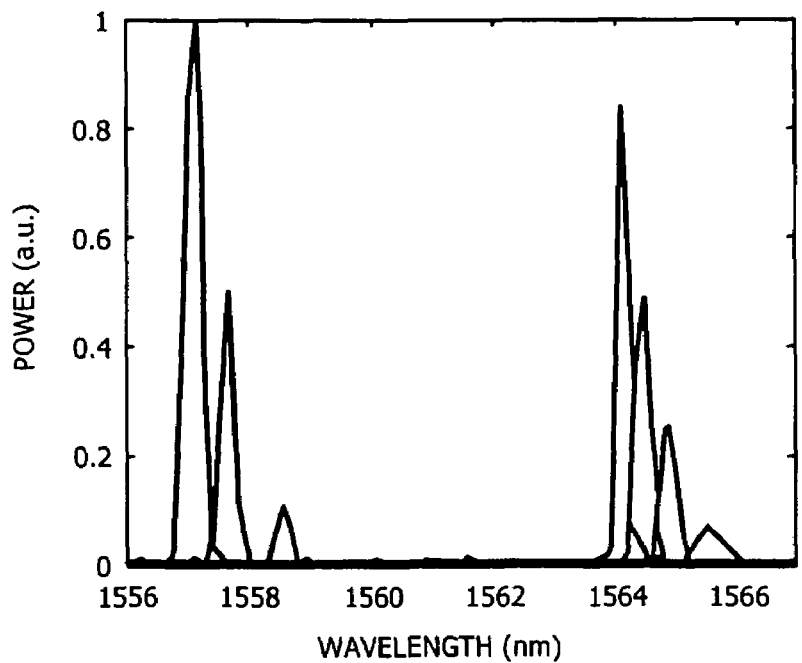
FIGS. 4a and 4b are graphs confirming the orthogonally of the polarized lasing modes and FIG. 4c illustrates the Q-switching.
Figure 4A:
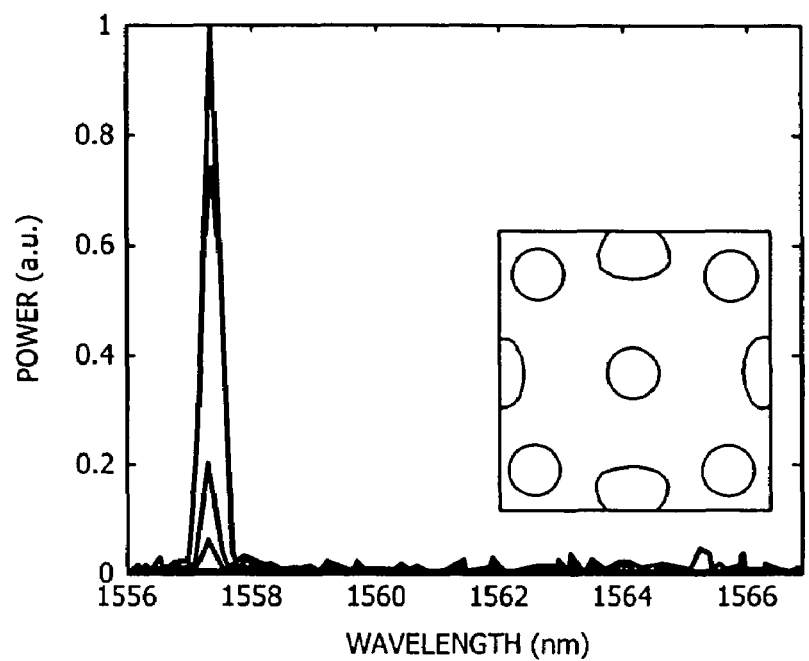
Figure 4B:
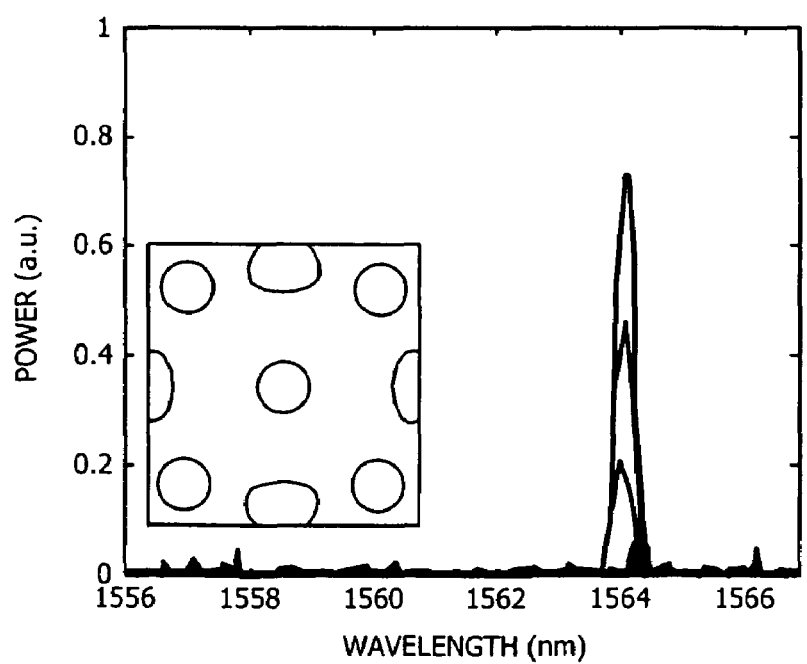

FIGS. 4a and 4b confirm the orthogonally polarized lasing modes and Q-switching. FIG. 4a is the laser spectra is taken with photo addressable polymer/liquid crystal layer 16/34 aligned with the Y axis and the collected light is passed through a polarizer oriented at various angles. The collected power is maximized with the polarizer oriented at 0° (X axis) and minimized at 90° (Y axis) which indicates the resonance is the X polarized dipole mode. FIG. 4b is the laser spectra is taken with the same conditions as in FIG. 4a but with the photo addressable polymer/liquid crystal layer 16/34 aligned with the X axis. The collected power is maximized with the polarizer oriented at 90° (Y axis) and minimized at 0° (X axis) which indicates the resonance is the Y-polarized dipole mode. The insets in FIGS. 4a and 4b show simulation of cavity modes' polarization profile. FIG. 4c is the laser spectra as taken after laser 20 writing the photo addressable polymer 16 aligns the photo addressable polymer/liquid crystal layer 16/34 at several orientations. After writing at 0° (writing laser 20 polarized along X axis which causes photo addressable polymer/liquid crystal layer 16/34 to orient along Y axis), emission is maximized for the X-polarized mode and minimized for the Y-polarized mode. As the photo addressable polymer writing laser polarization is rotated towards 90°, the cladding refractive index for the X mode increases, raising losses until the lasing is quenched and emission terminates. Meanwhile, the Y mode experiences a decreasing refractive index, lowering cavity losses and driving the mode above threshold and lases. The spectra in FIGS. 4a and 4b are normalized to the same power, different than in FIG. 4c.

The ultimate tunability of the photonic crystal laser 18 may be limited by the quantum well gain spectra. Future enhancements in the quantum well structure and cavity design can potentially further increase the tuning range far beyond the observed 7 nm. Lasing after liquid crystal infiltration requires maximal gain and minimal losses and both lasing modes are observed close to 1550 nm, the engineered maximum of the quantum well emission. If the grown quantum well structure were redesigned to exhibit two distinct maxima in the gain spectra and if the orthogonally polarized photonic crystal cavity modes can be designed to coincide with these gain maxima, then the laser tuning range may be further increased to over 100 nm.

The Q-switched photonic crystal lasers 18 can potentially fulfill a variety of scientific and technological needs. Beyond replacing conventional tunable laser sources in existing applications, the liquid crystal photonic crystal laser 18 can serve as a polarization sensitive optically triggered switch within optical information processing architectures.

Furthermore since the photo addressable polymer orientation is stable, no external energy or input, such as an electrostatic field, is required for the laser to maintain its lasing state. Liquid crystal photonic crystal laser arrays can also serve as an optical reprogrammable read-only memory elements. More significantly, the successful integration of liquid crystal and photo addressable polymer 16, which is itself a material with enormous potential with photonics integration, in the creation of the Q-switched photonic crystal laser 18 represents an initial step in demonstrating the full potential of integrating semiconductor nanophotonics with optical polymers. In particular, integration of nanophotonics with birefringent nonlinear materials enables the complete utilization of polarization as a degree of freedom for efficient light sources and detectors in integrated opto-fluidic systems.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following invention and its various embodiments.

Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations. A teaching that two elements are combined in a claimed combination is further to be understood as also allowing for a claimed combination in which the two elements are not combined with each other, but may be used alone or combined in other combinations. The excision of any disclosed element of the invention is explicitly contemplated as within the scope of the invention.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

I claim:

1. A method for extending the range of spectral range of a photonic crystal laser, having a characterizing ambient refractive index, comprising:
   operating the laser in a first high-Q mode; and
   selectively changing the ambient refractive index in the laser through a predetermined threshold to selectively switch operation of the laser to a second high-Q mode by changing the Q of the first high-Q mode and thereby extending a range of the laser;
   optically aligning the molecular orientation of a photo addressable polymer layer adjacent to a liquid crystal layer infiltrated into the laser to selectively establish the first or second high-Q mode of operation,
   wherein the laser has at least two lasing states and where optically aligning the molecular orientation of the photo addressable polymer layer comprises optically switching cavity modes within the laser without any requirement of external electrical energy to maintain the lasing state of the laser.

2. The method of claim 1 wherein the laser is fabricated in a photonic crystal having a plurality of holes into which a birefringent material has been infiltrated and where changing the ambient refractive index comprises rotating the molecular orientation of the birefringent material infiltrated into the holes of the photonic crystal to switch between the first and second high-Q modes.

3. The method of claim 1 wherein changing between the first and second high Q modes comprises switching between lasing emission wavelengths, polarizations or both.

4. The method of claim 1 wherein changing the ambient refractive index in the photonic crystal laser through a predetermined threshold comprises changing the ambient refractive index sufficiently to quench lasing in the first mode and operate in the second mode.

5. The method of claim 1 wherein optically switching cavity modes within the laser comprises optically switching a memory element.

6. A Q-switched laser comprising:
   a photonic crystal layer having a plurality of holes;
   a birefringent material with low refractive losses and low optical loses with controllable spatial refractive index orientation infiltrated into the holes; and
   means for Q-switching between at least two cavity modes in the laser to extend the spectral emission range of the laser by rotating the molecular orientation or changing the physical orientation of the birefringent material infiltrated into the holes of the photonic crystal laser,
   wherein the laser has a lasing state and where the means for rotating the molecular orientation or for changing the physical orientation of the birefringent material comprises an optically triggered photo-addressable-polymer/liquid-crystal alignment layer to enable an all-optical implementation with no external energy source required for the laser to maintain the lasing state.

7. The improvement of claim 6 wherein the means for rotating the molecular orientation or for changing the physical orientation of the birefringent material comprises a photonic crystal laser wavelength tuning mechanism for selecting one of two orthogonally polarized lasing modes.

8. The improvement of claim 6 wherein the means for rotating the molecular orientation or for changing the physical orientation of the birefringent material comprises means for producing a photonic crystal lasing emission polarization controlled by selection of one of two orthogonally polarized lasing modes.

* * * * *